(12) United States Patent
Kim et al.

(10) Patent No.: US 10,153,451 B2
(45) Date of Patent: Dec. 11, 2018

(54) ORGANIC LIGHT EMITTING DEVICE

(71) Applicant: LG Display Co., Ltd., Seoul (KR)

(72) Inventors: Taeshick Kim, Gyeonggi-do (KR); Younseok Kam, Seoul (KR); Ki-Woog Song, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/465,975

(22) Filed: Mar. 22, 2017

(65) Prior Publication Data

US 2017/0288161 A1    Oct. 5, 2017

(30) Foreign Application Priority Data

Mar. 31, 2016  (KR) .................. 10-2016-0039506

(51) Int. Cl.
*H01L 51/50* (2006.01)

(52) U.S. Cl.
CPC ........ *H01L 51/504* (2013.01); *H01L 51/5024* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| 2008/0180023 | A1* | 7/2008 | Tobise | ................ | C09K 11/06 313/504 |
| 2012/0097989 | A1* | 4/2012 | Lee | .................... | H01L 51/5278 257/88 |
| 2012/0248971 | A1* | 10/2012 | Okuyama | ............. | C09K 11/06 313/504 |
| 2014/0070196 | A1* | 3/2014 | Kim | ...................... | H01L 51/504 257/40 |

* cited by examiner

*Primary Examiner* — Joseph Schoenholtz
(74) *Attorney, Agent, or Firm* — Morgan, Lewis & Bockius LLP

(57) ABSTRACT

An organic light emitting device includes a first emitting part on an anode, the first emitting part including a first emission layer and a first hole transport layer a second emitting part on the first emitting part, the second emitting part including a second emission layer and a second hole transport layer; a third emitting part on the second emitting part including a third emission layer and a third hole transport layer; and a cathode on the third emitting part. The third emitting part further includes a fourth emission layer to emit light having a same color as the third emission layer and includes a dopant and a mixed host of at least two hosts, and a fourth hole transport layer provided on the third hole transport layer while in contact with the third emission layer, and has a hole mobility lower than that of the third hole transport layer.

19 Claims, 5 Drawing Sheets

ORGANIC LIGHT EMITTING DEVICE

CROSS REFERENCE TO RELATED APPLICATIONS

This application claims the benefit of the Korean Patent Application No. 10-2016-0039506 filed on Mar. 31, 2016, which is hereby incorporated by reference as if fully set forth herein.

BACKGROUND

Field of the Disclosure

Embodiments of the present invention relate to an organic light emitting device, and more particularly, to an organic light emitting device which is capable of achieving high emission efficiency and long lifespan.

Discussion of the Related Art

An organic light emitting display (OLED) device is a self light emitting display device using an organic light emitting device, and may be fabricated at a lightweight and slim size as it does not need a separate light source unlike a liquid crystal display (LCD) device. Also, the organic light emitting display device is favorable in view of power consumption due to low voltage driving and also is excellent for color realization, a response speed, a viewing angle, and a contrast ratio (CR), whereby the organic light emitting display device has been studied as a display for next generation.

The organic light emitting device is provided in such a structure that an emission layer using an organic material is formed between two electrodes of anode and cathode. Herein, when an electron generated in the cathode and a hole generated in the anode are injected into the inside of the emission layer, exciton is produced by the injected electron and hole, to thereby generate light. In this case, the organic light emitting device is driven by the use of a thin film transistor.

The emission layer of the organic light emitting device includes a host material and a dopant material, and light is generated in the emission layer by an interaction of the host material and the dopant material. The host generates the exciton from the electron and hole, and transmits energy to the dopant. The dopant comprises a dyeing organic material, and a small amount of dopant is added to the emission layer. The dopant receives the energy from the host, and converts the received energy into the light. Especially, it is possible to obtain desire colored light in accordance with a bandgap of the dopant.

SUMMARY

In case of a related art organic light emitting device, it has limitations on emission efficiency and lifespan due to a high driving voltage and the properties of an organic material. Thus, various methods for improving the emission efficiency and lifespan have been proposed.

An organic light emitting device requires a high driving voltage when a hole is transferred from an anode to an emission layer due to a high energy barrier there-between. Thus, a hole injection layer and a hole transport layer are provided between the anode and the emission layer so that it is possible to improve a hole injection capacity and a hole transport capacity, and thus to lower a driving voltage.

In the same manner as the aforementioned hole transfer, an electron injection layer and an electron transport layer are additionally provided between a cathode and the emission layer when an electron is injected from the cathode to the emission layer, so that it is possible to improve an electron injection capacity and an electron transport capacity, and thus to lower a driving voltage.

However, when the hole is injected from the anode to the emission layer or the electron is injected from the cathode to the emission layer, the electron and hole might not be coupled to each other, and the electron might overflow to the hole injection layer or the hole might overflow to the electron injection layer. In this case, the exciton is not produced by the coupling of the hole and electron in the emission layer, that is, the exciton has not contributed to the light emission, which results in lowering emission efficiency and shortened lifespan of the organic light emitting device.

The organic light emitting device is formed of a material which uses the phenomenon of phosphorescence and the phenomenon of fluorescence, wherein the phenomenon of phosphorescence indicates that a light emission persists for a long time even after a removal of an external stimulus applied to a certain object, and the phenomenon of fluorescence indicates a light emission is stopped immediately after a removal of an external stimulus applied to a certain object. In this case, an emission time period of a phosphorescent material is relatively longer than an emission time period of a fluorescent material. This is because an electron in the phosphorescent material gradually loses its energy by passing through a meta-stable state from an excited state to a ground state. Meanwhile, in case of the fluorescent material, an electron firstly becomes an excited state, and then directly becomes a ground state, whereby the emission time period of the fluorescent material is relatively shorter than the emission time period of the phosphorescent material.

Among materials for emission layers included in the organic light emitting device, a blue emission layer is generally formed of the fluorescent material, unlike other emission layers using the phosphorescent material. Theoretically, quantum efficiency of the blue emission layer using the fluorescent material is about 25% in comparison to quantum efficiency of the other emission layers using the phosphorescent material. Accordingly, the problems related with the emission efficiency and lifespan become more serious in the blue emission layer using the fluorescent material, in comparison to the other emission layers using the phosphorescent material.

The aforementioned problems have been recognized, and a new organic light emitting device capable of achieving high emission efficiency and long lifespan has been proposed through various tests by inventors of the present invention.

Accordingly, the present invention is directed to an organic light emitting device that substantially obviates one or more of the problems due to limitations and disadvantages of the related art.

An object of the present invention is to provide an organic light emitting device capable of achieving high emission efficiency and long lifespan.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of embodiments of the invention, as embodied and broadly described herein, an organic light emitting device comprises a first emitting part on an anode, the first emitting part including a first emission layer and a first hole transport layer; a second emitting part on the first emitting part, the second emitting part including a second emission layer and a second hole transport layer; a third emitting part on the second emitting part, the third emitting part including a third emission layer and a third hole transport layer; and a cathode on the third emitting part, wherein the third emitting part further includes a fourth emission layer which emits light whose color is the same as that of the third emission layer and is provided on the third emission layer, and a fourth hole transport layer which is provided on the third hole transport layer and is in contact with the third emission layer.

At this time, a hole mobility of the fourth hole transport layer may be lower than a hole mobility of the third hole transport layer.

Also, the hole mobility of the third hole transport layer may be $5.0\times10^{-5}$ cm$^2$/Vs~$9.0\times10^{-3}$ cm$^2$/Vs, and the hole mobility of the fourth hole transport layer may be $5.0\times10^{-6}$ cm$^2$/Vs~$5.0\times10^{-4}$ cm$^2$/Vs.

At least one of the first to fourth emission layers may include a mixed host, obtained by mixing at least two hosts, and a dopant.

At least one of the first emitting part, the second emitting part and the third emitting part may further include an electron transport layer.

In addition, the organic light emitting device may further include a first charge generation layer between the first emitting part and the second emitting part, and a second charge generation layer between the second emitting part and the third emitting part.

At this time, the third emission layer and the fourth emission layer may emit blue light.

Also, the second emission layer may emit yellow and green light, and the second emitting part may further include a fifth emission layer which emits red light.

In another aspect, an organic light emitting device comprises a first emitting part on an anode, the first emitting part including a first emission layer and a first hole transport layer; a second emitting part on the first emitting part, the second emitting part including a second emission layer and a second hole transport layer; a third emitting part on the second emitting part, the third emitting part including a third emission layer and a third hole transport layer; and a cathode on the third emitting part, wherein the third emitting part further includes a fourth emission layer which emits light whose color is the same as that of the third emission layer and includes a dopant and a mixed host obtained by mixing at least two hosts for enhancing an emission efficiency, and a fourth hole transport layer which is provided on the third hole transport layer and is in contact with the third emission layer, and has a hole mobility which is lower than that of the third hole transport layer so as to prevent an electron transfer.

At this time, a hole mobility of the third hole transport layer may be $5.0\times10^{-5}$ cm$^2$/Vs~$9.0\times10^{-3}$ cm$^2$/Vs, and the hole mobility of the fourth hole transport layer may be $5.0\times10^{-6}$ cm$^2$/Vs~$5.0\times10^{-4}$ cm$^2$/Vs.

At least one of the first emitting part, the second emitting part and the third emitting part may further include an electron transport layer.

In addition, the organic light emitting device may further include a first charge generation layer between the first emitting part and the second emitting part, and a second charge generation layer between the second emitting part and the third emitting part.

In another aspect, an organic light emitting device comprises a first emitting part on an anode, the first emitting part including a first emission layer; a second emitting part on the first emitting part, the second emitting part including a second emission layer; a third emitting part on the second emitting part, the third emitting part including a third emission layer; and a cathode on the third emitting part, wherein the second emitting part further includes a fourth emission layer provided below the second emission layer, and the third emitting part further includes a fifth emission layer which emits light whose color is the same as that of the third emission layer and is provided on the third emission layer.

At this time, the third emission layer and the fifth emission layer may emit blue light.

Also, the second emission layer may emit yellow and green light, and, the fourth emission layer may emit red light.

At least one of the first to fifth emission layers includes a dopant and a mixed host obtained by mixing at least two hosts.

At least one of the first emitting part, the second emitting part and the third emitting part may further include at least one of electron transport layer and hole transport layer.

In addition, the organic light emitting device may further include a first charge generation layer between the first emitting part and the second emitting part, and a second charge generation layer between the second emitting part and the third emitting part.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiments of the invention and together with the description serve to explain the principle of embodiments of the invention. In the drawings.

DETAILED DESCRIPTION

Figure 1:
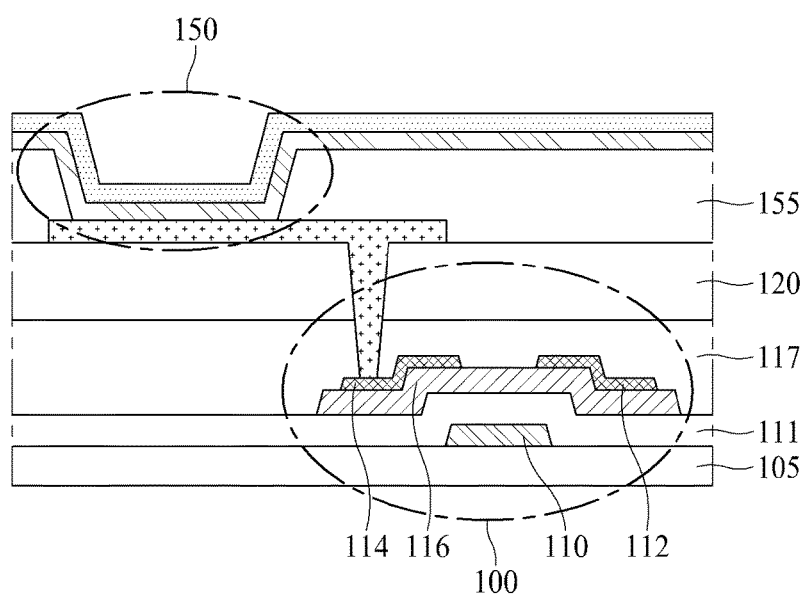
FIG. 1 is a cross sectional view illustrating some parts of an organic light emitting display device including a thin film transistor and an organic light emitting device according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In description of embodiments of the present invention, when a structure is described as being formed at an upper portion/lower portion of another structure or on/under the other structure, this description should be construed as including a case where the structures contact each other and moreover, a case where a third structure is disposed therebetween.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

FIG. 1 is a cross sectional view illustrating some parts of an organic light emitting display device including a thin film transistor 100 and an organic light emitting device 150 according to the embodiment of the present invention.

Referring to FIG. 1, the thin film transistor 100 and the organic light emitting device 150 are disposed on a substrate 105.

The substrate 105 may be formed of glass or a flexible plastic substrate, and the substrate 105 facilitates forming the thin film transistor 100 and organic light emitting device 150 thereon.

The thin film transistor 100 may include a gate electrode 110, a source electrode 112, a drain electrode 114, and a semiconductor layer 116, wherein the thin film transistor 100 is provided on the substrate 105. The thin film transistor 110 may further include a gate insulating film 111 and a passivation film 117.

The semiconductor layer 116 may be formed of amorphous silicon, polycrystalline silicon whose mobility is greater than that of the amorphous silicon, or oxide semiconductor such as ZnO (Zinc Oxide) or IGZO (Indium-Gallium-Zinc Oxide) with good mobility and uniformity.

The gate electrode 110 functions as a switch of the thin film transistor 100. The gate electrode 110 may be formed of a conductive metal material, for example, copper (Cu), aluminum (Al), molybdenum (Mo), and their alloys.

The gate insulating film 111 may be an insulating film having a singular-layered structure or multi-layered structure of silicon oxide (SiOx) or silicon nitride (SiNx). The gate insulating film 111 prevents a current of the semiconductor layer 116 from flowing into the gate electrode 112.

The source electrode 112 and the drain electrode 114 transmit an externally-provided electrical signal from the thin film transistor 100 to the organic light emitting device 150. In this case, the source electrode 112 and the drain electrode 114 may be formed of a conductive metal material, for example, copper (Cu), aluminum (Al), molybdenum (Mo), and their alloys, or may be formed of a transparent conductive material such as ITO (Indium Tin Oxide) or IZO (Indium Zinc Oxide).

The passivation film 117 may be formed of an inorganic insulating film of silicon oxide (SiOx) or silicon nitride (SiNx), or may be formed of an organic insulating film of photo acryl. The passivation film 117 prevents an unnecessary electrical connection between elements of the thin film transistor 100, and also prevents the elements of the thin film transistor 100 from being contaminated or damaged.

FIG. 1 shows the thin film transistor 100 having an inverted staggered structure, but not limited to this structure. The thin film transistor 100 may have a coplanar structure.

An overcoat layer 120 may be provided on the thin film transistor 100 so as to protect the thin film transistor 100 and to improve a step coverage for the thin film transistor 100. In this case, the overcoat layer 120 may be formed of an organic material such as photo acryl.

The organic light emitting device 150 may be provided on the thin film transistor 100. A detailed structure and function of the organic light emitting device 150 will be shown in the following description for the first to third embodiments of the present invention.

A bank 155 may be formed of an inorganic insulating material such as silicon oxide (SiOx) or silicon nitride (SiNx), or may be formed of an organic insulating material such as photo acryl. The bank 155 is provided to separate individual pixels of the organic light emitting device 150 from each other.

Figure 2:
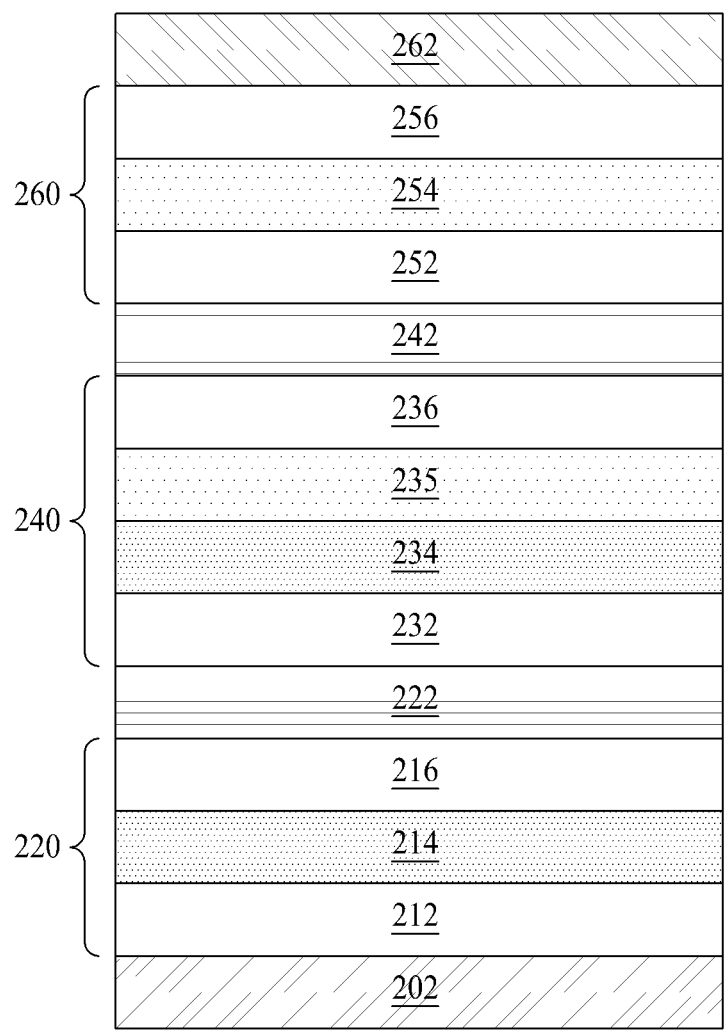
FIG. 2 is a cross sectional view illustrating an organic light emitting device according to a first embodiment of the present invention.

FIG. 2 is a cross sectional view illustrating an organic light emitting device 200 according to the first embodiment of the present invention.

Referring to FIG. 2, the organic light emitting device 200 may include an anode 202, a first emitting part 220, a second emitting part 240, a third emitting part 260, and a cathode 262.

The anode 202 is electrically connected with the thin film transistor described with reference to FIG. 1 via a contact hole. The anode 202 is an electrode for injecting a hole with a positive charge to an emission layer. For an easy injection of the hole with the positive charge, the anode 202 may be formed of a transparent material such as ITO (Indium Tin Oxide) or IZO (Indium Zinc Oxide).

The anode 202 serves as a transparent layer in a bottom emission type, and also serves as a reflection layer in a top emission type.

The cathode 262 is provided at the opposite side of the anode 202 in the organic light emitting device 200. The cathode 262 is an electrode for injecting an electron with a negative charge to the emission layer of the organic light emitting device 200. For an easy injection of the electron with the negative charge, the cathode 262 may be formed of any one of metal materials of aurum (Au), argentum (Ag), aluminum (Al), molybdenum (Mo) and magnesium (Mg), or their alloys.

In order to apply the organic light emitting device according to the present invention to a large-sized and high-definition next generation display device, the organic light emitting device according to the present invention is formed in such a way that a plurality of emission layers with complementary colors are sequentially deposited to emit white light, unlike a related art organic light emitting device which has an individual deposition structure for each pixel of red, green and blue pixels. In this case, it is possible to realize predetermined color light such as red, green and blue light according as the white light emitted from the organic light emitting device according to the present invention passes through color filters.

For example, if a blue emission layer and a yellow emission layer are deposited, white light is emitted in accordance with formation of an emission peak in a blue wavelength region and a yellow wavelength region. According as the emitted white light passes through red, green and blue color filters, it is possible to realize red, green and blue light.

Accordingly, the aforementioned sequential deposition structure of the emission layers in the organic light emitting device according to the present invention overcomes difficulties of manufacturing process in the related art individual deposition structure for each pixel, whereby it is possible to apply the organic light emitting device according to the present invention to a large-sized and high-definition next generation display device.

The first emitting part 220, which is provided on the anode 202, may include a first hole transport layer 212, a first emission layer 214, and a first electron transport layer 216.

In addition, a hole injection layer for a smooth injection of the hole from the anode 202 may be disposed on the anode 202. The hole injection layer may be formed of MTDATA (4,4',4"-tris(3-methylphenylphenylamino)triphenylamine), CuPc (copper phthalocymine) or PEDOT/PSS (poly(3,4-ethylenedioxythiphene, polystyrene sulfonate).

The first hole transport layer 212 supplies the hole to the first emission layer 214, and the first electron transport layer 216 supplies the electron, which is provided from the cathode 262, to the first emission layer 214. The first hole transport layer 212 may be formed of TPD (N,N'-bis(3-methylphenyl)-N,N'-bis(phenyl)-benzidine) or NPB (N,N'-bis(naphthalen-1-yl)-N,N'-bis(phenyl)-benzidine).

The first emission layer 214 emits light by a coupling of the hole supplied by the first hole transport layer 212 and the electron supplied by the first electron transport layer 216.

The first electron transport layer 216 may be formed of oxadiazole, triazole, phenanthroline, benzoxazole or benzthiazole. In addition, an electron injection layer may be additionally disposed on the first electron transport layer 216.

The first emission layer 214 may be an emission layer of emitting blue light. In this case, a peak wavelength of light emitted from the first emission layer 214 may be within a range from 440 nm to 480 nm.

The second emitting part 240, which is provided on the first emitting part 220, may include a second hole transport layer 232, a second emission layer 234, and a second electron transport layer 236. Herein, the second hole transport layer 232 and the second electron transport layer 236 included in the second emitting part 240 are substantially identical to the first hole transport layer 212 and the first electron transport layer 216 included in the first emitting part 220, whereby a detailed description for the second hole transport layer 232 and the second electron transport layer 236 included in the second emitting part 240 will be omitted.

The second emission layer 235 may be an emission layer of emitting yellow-green light. In this case, a peak wavelength of light emitted from the second emission layer 235 may be within a range from 510 nm to 590 nm.

The second emitting part 240 may further include a third emission layer 234 corresponding to an auxiliary emission layer, wherein a color of light emitted from the third emission layer 234 is different from that a color of light emitted from the second emission layer 235. The third emission layer 234 may be an emission layer of emitting red light. In this case, a peak wavelength of light emitted from the third emission layer 234 may be within a range from 600 nm to 650 nm.

When the third emission layer 234 is additionally provided in the second emitting part 240, it is possible to achieve wide color gamut, and furthermore, it is possible to provide the organic light emitting device capable of realizing more sharp and realistic images. If only providing the yellow-green emission layer, both red and green colors are displayed by the use of yellow-green emission layer, thereby lowering efficiency of the red light. In order to overcome this problem, the red emission layer is additionally provided in the second emitting part 240. The red emission layer is disposed closer to the first electrode 202 than the yellow-green emission layer, whereby it is possible to emit light having a wavelength within a range from 600 nm to 650 nm, which corresponds to the red emission layer, to thereby improve a color realization ratio.

Each of the second emission layer 235 and the third emission layer 234 may include at least one host and dopant. Each of the second emission layer 235 and the third emission layer 234 may include a mixed host obtained by mixing at least two hosts, and at least one dopant. The mixed host may include a host with a hole transport property, and a host with an electron transport property. In this case, the mixed host may include a pre-mixed host obtained by previously mixing at least two hosts.

If the mixed host is used for the second emission layer 235 and the third emission layer 234, it is possible to overcome a problem related with the exciton limited to the certain areas of the emission layer when using a single host. That is, the coupling of hole and electron is made in the entire area of the emission layer, whereby a coupling rate of the hole and electron may be higher. That is, it is likely that the exciton combined with the hole and electron is not formed along the interface between the emission layer and the hole transport layer or the interface between the emission layer and the electron transport layer, but formed in the entire area of the emission layer.

Accordingly, the exciton may be generated in the entire area of the emission layer, to thereby realize high emission efficiency and long lifespan of the emission layer.

A first charge generation layer 222 may be additionally provided between the first emitting part 220 and the second emitting part 240. The first charge generation layer 222 controls a charge balance between the first emitting part 220 and the second emitting part 240.

The first charge generation layer 222 may further include an N-type charge generation layer and a P-type charge generation layer. The N-type charge generation layer is provided to inject the electron into the first emitting part 220.

The N-type charge generation layer may be formed of an organic layer doped with alkali metal such as lithium (Li), natrium (Na), kalium (K) or cesium (Cs), or alkali earth metal such as magnesium (Mg), strontium (Sr), barium (Ba) or radium (Ra).

The P-type charge generation layer is provided to inject the hole into the second emitting part 240. The P-type charge generation layer may be formed of an organic layer including P-type dopant.

The third emitting part 260, which is disposed on the second emitting part 240, may include a third hole transport layer 252, a fourth emission layer 254, and a third electron transport layer 256. The third hole transport layer 252 and the third electron transport layer 256 included in the third emitting part 260 are substantially identical to the first hole transport layer 212 and the first electron transport layer 216 included in the first emitting part 220, whereby a detailed description for the third hole transport layer 252 and the third electron transport layer 256 included in the third emitting part 260 will be omitted.

The fourth emission layer 254 may be an emission layer of emitting blue light. In this case, a peak wavelength of light emitted from the fourth emission layer 254 may be within a range from 440 nm to 480 nm. According as the third emitting part 260 including the fourth emission layer 254 of emitting the blue light, which is identical to the light emitted from the first emission layer 214, is provided in the organic light emitting device, it is possible to overcome problems related with emission efficiency and lifespan of the blue emission layer using the fluorescent material.

A second charge generation layer 242 may be additionally provided between the second emitting part 240 and the third emitting part 260. The second charge generation layer 242 controls a charge balance between the second emitting part 240 and the third emitting part 260. The second charge generation layer 242 is substantially identical to the first charge generation layer 222, whereby a detailed description for the second charge generation layer 242 will be omitted.

Figure 3:
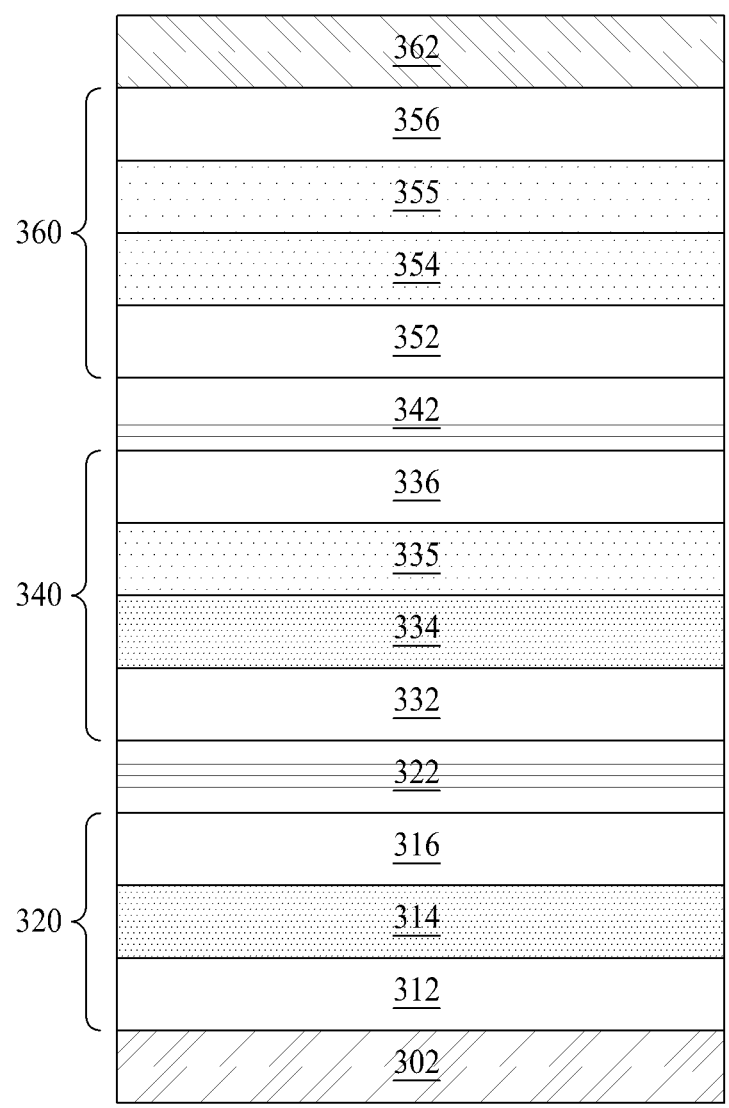
FIG. 3 is a cross sectional view illustrating an organic light emitting device according to a second embodiment of the present invention.

FIG. 3 is a cross sectional view illustrating an organic light emitting device 300 according to the second embodiment of the present invention.

Referring to FIG. 3, the organic light emitting device 300 according to the second embodiment of the present invention may include an anode 302, a first emitting part 320, a second emitting part 340, a third emitting part 360, and a cathode 362. In addition, the organic light emitting device 300 according to the second embodiment of the present invention may further include an electron injection layer for a smooth injection of electron from the cathode 362, and a hole injection layer for a smooth injection of hole from the anode 302.

Also, a first charge generation layer 322 is additionally provided between the first emitting part 320 and the second emitting part 340, and a second charge generation layer 342 is additionally provided between the second emitting part 340 and the third emitting part 360.

The anode 302, the first emitting part 320, the first charge generation layer 322, the second emitting part 340, the second charge generation layer 342, and the cathode 362 included in the organic light emitting device 300 according to the second embodiment of the present invention are substantially identical to the anode 202, the first emitting part 220, the first charge generation layer 222, the second emitting part 240, the second charge generation layer 242, and the cathode 262 included in the organic light emitting device 200 shown in FIG. 2 according to the first embodiment of the present invention, whereby a detailed description for the anode 302, the first emitting part 320, the first charge generation layer 322, the second emitting part 340, the second charge generation layer 342, and the cathode 362 included in the organic light emitting device 300 according to the second embodiment of the present invention will be omitted.

The third emitting part 360 is disposed on the second emitting part 340, and the third emitting part 360 may include a third hole transport layer 352, a third emission layer 354, and a third electron transport layer 356. The third emitting part 360 may further include a fourth emission layer 355 which is in contact with the third emission layer 354.

The third emission layer 354 and the fourth emission layer 355 may be an emission layer of emitting blue light. A peak wavelength of light emitted from the third emission layer 354 and the fourth emission layer 355 may be within a range from 440 nm to 480 nm. According as the two emission layers 354 and 355 corresponding to the blue emission layer are included in the third emitting part 360, it is possible to improve emission efficiency and lifespan of the blue emission layer using the fluorescent material.

The third emission layer 354 may include at least one host and at least one dopant. The fourth emission layer 355 may include a mixed host obtained by mixing at least two hosts, and at least one dopant. The mixed host may include a host with a hole transport property, and a host with an electron transport property. In this case, the mixed host may include a pre-mixed host obtained by previously mixing at least two hosts.

When the fourth emission layer 355 includes the mixed host instead of a single host, electron mobility becomes faster. It enables a rapid transfer of the electron from the cathode 362 to the third emission layer 354 included in the third emitting part 360, and also enables the increases of coupling of the electron and hole in the third emission layer 354, to thereby improve the emission efficiency of the blue emission layer.

The same structure of the third emission layer 354 and the fourth emission layer 355 included in the third emitting part 360 may be applicable to the blue emission layer of the first emitting part 320.

For uniformity in deposition of the host and dopant, the mixed host for the fourth emission layer 355 is manufactured by a co-deposition process of depositing at least two hosts at the same time in one chamber.

Figure 4:
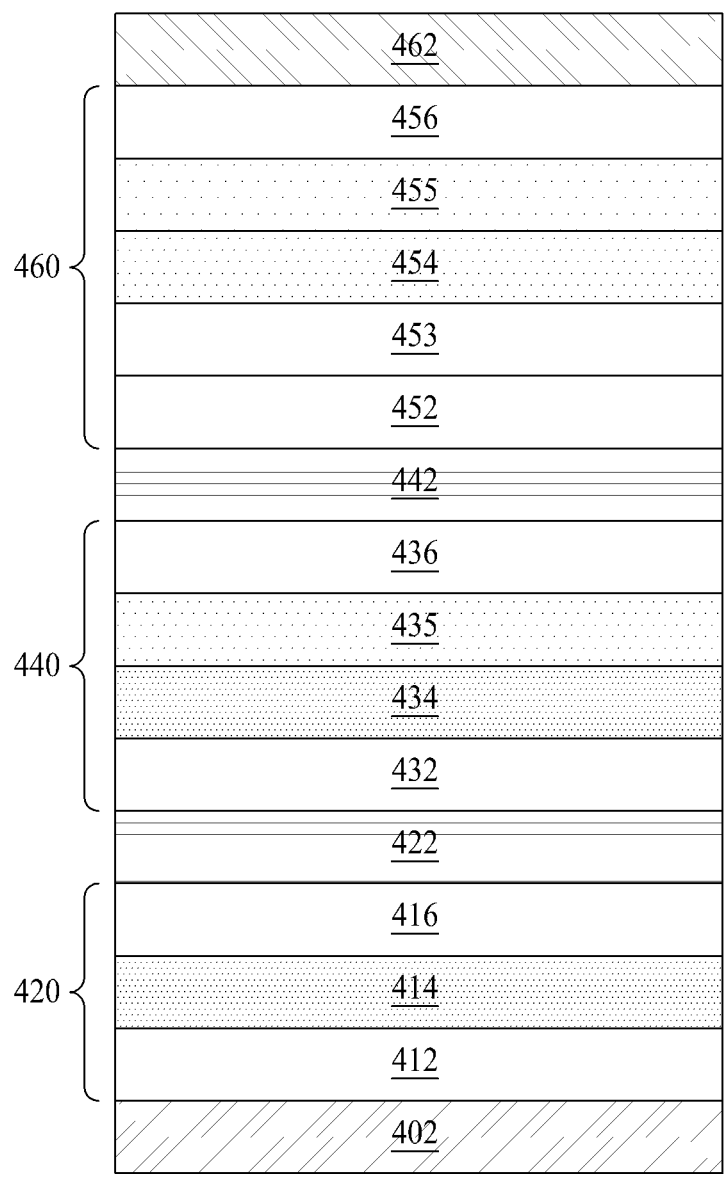
FIG. 4 is a cross sectional view illustrating an organic light emitting device according to a third embodiment of the present invention.

FIG. 4 is a cross sectional view illustrating an organic light emitting device 400 according to the third embodiment of the present invention.

Referring to FIG. 4, the organic light emitting device 400 according to the third embodiment of the present invention may include an anode 402, a first emitting part 420, a second emitting part 440, a third emitting part 460, and a cathode 462. The organic light emitting device 400 according to the third embodiment of the present invention may further include an electron injection layer for a smooth injection of electron from the cathode 462, and a hole injection layer for a smooth injection of hole from the anode 402. Also, a first charge generation layer 422 may be additionally provided between the first emitting part 420 and the second emitting part 440, and a second charge generation layer 442 may be additionally provided between the second emitting part 440 and the third emitting part 460.

A function and structure of the anode 402, the first emitting part 420, the first charge generation layer 422, the second emitting part 440, the second charge generation layer 442, and the cathode 462 included in the organic light emitting device 400 according to the third embodiment of the present invention is substantially identical to a function and structure of the anode 202, the first emitting part 220, the first charge generation layer 222, the second emitting part 240, the second charge generation layer 242, and the cathode 262 included in the organic light emitting device 200 shown in FIG. 2 according to the first embodiment of the present invention, whereby a detailed description for the anode 402, the first emitting part 420, the first charge generation layer 422, the second emitting part 440, the second charge generation layer 442, and the cathode 462 included in the organic light emitting device 400 according to the third embodiment of the present invention will be omitted.

The third emitting part 460 is disposed on the second emitting part 440. The third emitting part 460 may include a third hole transport layer 452, a fourth emission layer 454, and a third electron transport layer 456.

The third emitting part 460 may further include a fifth emission layer 455 which is disposed adjacent to the fourth emission layer 454.

The fourth emission layer 454 and the fifth emission layer 455 may be an emission layer of emitting blue light. A peak wavelength of light emitted from the fourth emission layer 454 and the fifth emission layer 455 may be within a range from 440 nm to 480 nm.

The fourth emission layer 454 may include at least one host and at least one dopant. Also, the fifth emission layer 455 may include a mixed host obtained by mixing at least two hosts so as to realize high electron mobility, and at least one dopant. The mixed host may include a host with a hole transport property, and a host with an electron transport property. The mixed host may include a pre-mixed host obtained by previously mixing at least two hosts.

The same structure of the fourth emission layer 454 and the fifth emission layer 455 included in the third emitting part 460 may be applicable to the blue emission layer of the first emitting part 420.

The blue host included in the first emitting part and the third emitting part may include an anthracene-based material, and may include one or two among phenyl, biphenyl, naphthyl, anthracenyl, pyrenyl, peryrenyl at the position of number 2, number 9 or number 10. In this case, functional groups positioned at the number 2, number 9 or number 10 may not be the same. The third hole transport layer 452 and the fourth hole transport layer 453 may be formed of materials whose hole mobilities are different from each other. The hole mobility of the fourth hole transport layer 453 may be relatively slower than the hole mobility of the third hole transport layer 452.

A hole transport material may be formed of a compound including a substituent with the hole transfer property at its core. The compound including the substituent with the hole transfer property may be any one among an amine-based material, a fluorene-based material, and a carbazole-based material.

For example, the compound including the substituent with the hole transfer property may be TPD (N,N'-bis(3-methylphenyl)-N,N'-bis(phenyl)-benzidine) or NPB (N,N'-bis(naphthalen-1-yl)-N,N'-bis(phenyl)-benzidine).

For example, the third hole transport layer 452 may be formed of NPD (N,N'-bis(naphthalene-1-yl)-N,N'-bis(phenyl)-2,2'-dimethylbenzidine).

The hole mobility of the third hole transport layer 452 may be within a range from $5.0 \times 10^{-5}$ cm$^2$/Vs~$9.0 \times 10^{-3}$ cm$^2$/Vs, and the hole mobility of the fourth hole transport layer 453 may be within a range from $5.0 \times 10^{-6}$ cm$^2$/Vs~$5.0 \times 10^{-4}$ cm$^2$/Vs.

Generally, the hole mobility shows how quickly the hole can move, which is specified in units of cm$^2$/Vs. The hole mobility is measured by TOF (Time Of Flight) method or TEL (Transient Electroluminescence) method. The TOF method is a method of flight time photoconductivity, which is a typical method of determining the charge transfer properties using a photocurrent. The TEL method is a method of checking a momentary response of a sample by the use of momentary rectangular pulse or pulse laser.

The hole mobility of the fourth hole transport layer 453 is relatively slower than the hole mobility of the third hole transport layer 452, whereby the fourth hole transport layer 453 shows the properties of an electron blocking layer to prevent a flow of the electron. Accordingly, the fourth hole transport layer 453 may prevent the transfer of the electron in the fourth emission layer 454.

In case of the third emitting part 460 which is relatively closer to the cathode as compared with the first emitting part 420 and the second emitting part 440, the electron may easily pass through the adjacent hole transport layer when the electron is injected into the emission layer. Thus, the fourth hole transport layer 453 of the third emitting part 460 has the properties of the electron blocking layer, whereby it is possible to maximize the staying time of the electron in the emission layer without the transfer from the emission layer to the hole transport layer, to thereby achieve high emission efficiency and long lifespan of the blue emission layer using the fluorescent material.

Through an experimental verification for the blue emission layers according to the first and third embodiments of the present invention, we can know that the emission efficiency in the blue emission layer according to the third embodiment of the present invention is improved by at least 10%.

In order to improve the emission efficiency of the blue light, the third emitting part includes the two blue emission layers, and the third emitting part includes the two hole transport layers whose hole mobilities are different from each other so that it is possible to provide the organic light emitting device capable of improving the blue emission efficiency and lifespan.

According to the properties of material, the material of the third hole transport layer 452 or fourth hole transport layer 453 may be used for the hole transport layer included in the first emitting part 420 or second emitting part 440. If providing the plurality of emitting portions using the same material of the hole transport layer, it is possible to simplify a manufacturing process of the organic light emitting device, and furthermore, to reduce a manufacturing cost.

Figure 5:
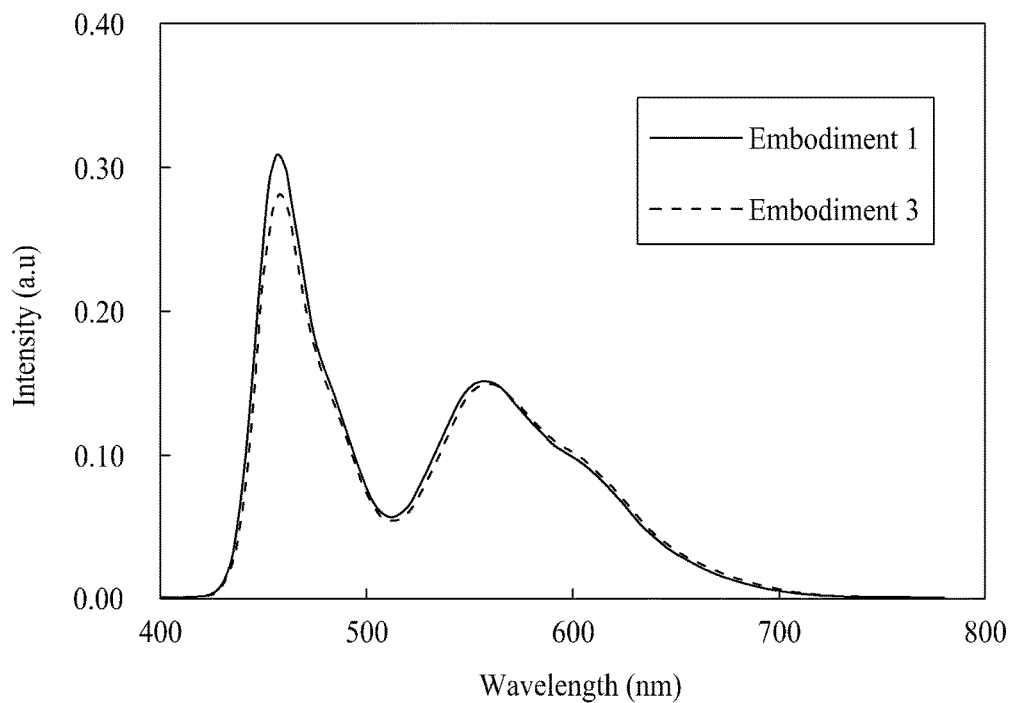
FIG. 5 shows an emission intensity in the organic light emitting devices according to the first and third embodiments of the present invention.

FIG. 5 shows an emission intensity in the organic light emitting devices according to the first and third embodiments of the present invention, which corresponds to an EL spectrum. The emission intensity may be a relative value with respect to a maximum value of the EL spectrum.

In FIG. 5, the horizontal axis indicates a wavelength of light (nm), and the vertical axis indicates the emission intensity (arbitrary unit, a.u.).

As shown in FIG. 5, a peak wavelength ($\lambda$max) of blue light is shown with a range from 440 nm to 480 nm, which corresponds to a blue region, in the first and third embodiments of the present invention. Also, a peak wavelength of yellow-green light is shown within a range from 530 nm to 590 nm, which corresponds to a yellow-green region, in the first and third embodiments of the present invention. In case of the third embodiment of the present invention, an emission intensity is increased in a range corresponding to the blue region, as compared with the first embodiment of the present invention. Accordingly, the emission efficiency of blue light is improved.

The peak wavelength (λmax) indicates a maximum wavelength of EL (Electroluminescence). At this time, a wavelength when organic layers included in the emitting part emit intrinsic light is referred to as PL (PhotoLuminescence), and light emitted under the influence of the optical characteristics and the thickness in each of the organic layers is referred to as an emittance. Also, EL (Electroluminescence) indicates light finally emitted from the organic light emitting display device, which may be expressed by multiplying PL (PhotoLuminescence) and emittance.

Figure 6:
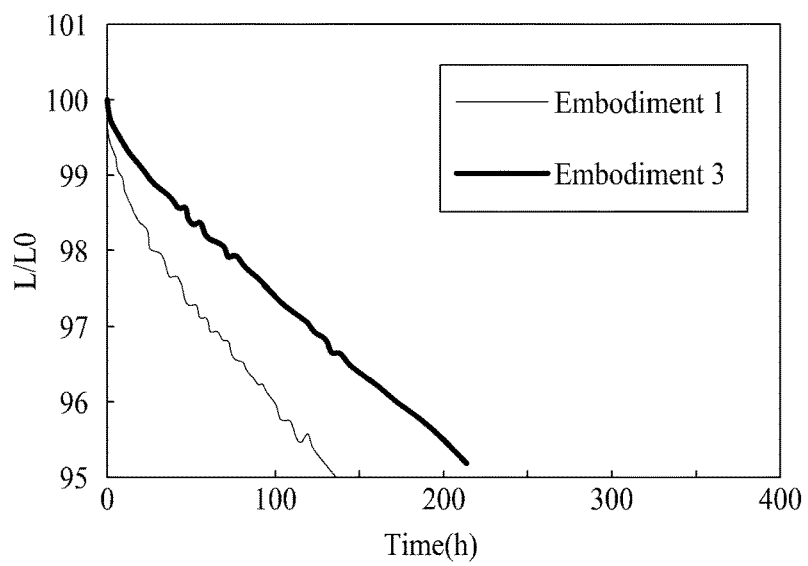
FIG. 6 shows a lifespan evaluation result in the organic light emitting devices according to the first and third embodiments of the present invention.

FIG. 6 shows a lifespan evaluation result in the organic light emitting devices according to the first and third embodiments of the present invention.

In FIG. 6, the horizontal axis indicates a time (h), and the vertical axis indicates a luminance reduction rate (L/L0). In case of the blue emission layer according to the first embodiment of the present invention, a period of time consumed until reaching about 95% of an initial emission luminance, that is, about 95% of lifespan of the organic light emitting device (T95) is about 140 hours. Meanwhile, in case of the blue emission layer according to the third embodiment of the present invention, a period of time consumed until reaching about 95% of an initial emission luminance, that is, about 95% of lifespan of the organic light emitting device (T95) is about 220 hours. That is, the lifespan of the blue emission layer according to the third embodiment of the present invention is improved as compared with the lifespan of the blue emission layer according to the first embodiment of the present invention. Thus, according as the third emitting part is provided with the two blue emission layers, and the two hole transport layers whose hole mobilities are different from each other, it is possible to realize the significantly improved lifespan of the organic light emitting device.

According to the embodiments of the present invention, the organic light emitting device according to the present invention is formed in such a way that a plurality of emission layers with complementary colors are sequentially deposited to emit white light so that it is possible to overcome difficulties of manufacturing process in the related art organic light emitting device having the individual deposition structure for each pixel, to thereby provide the large-sized and high-definition organic light emitting display device.

Also, the auxiliary emission layer of emitting the red light is additionally provided so that it is possible to achieve wide color gamut, and furthermore, it is possible to provide the organic light emitting display device capable of realizing more sharp and realistic images.

According to the embodiments of the present invention, one emitting portion is provided with the plurality of emission layers including the emission layer of emitting the blue light, to thereby improve the emission efficiency and lifespan of the blue emission layer using the fluorescent material.

According to the embodiments of the present invention, the fluorescent emission layer includes one dopant and the mixed host obtained by mixing the host with the hole transport property and the host with the electron transport property, whereby the coupling of hole and electron is made in the entire area of the emission layer, to thereby improve the emission efficiency and lifespan of the blue emission layer using the fluorescent material.

According to the embodiments of the present invention, the hole transport layer including the relatively-slow hole mobility and the hole transport layer including the relatively-rapid hole mobility are deposited in the emitting portion disposed adjacent to the cathode, whereby it is possible to prevent the electron of the emission layer from being transferred to the hole transport layer adjacent to the emission layer when the electron is injected into the emission layer, to thereby maximize the staying time of the electron in the emission layer, and furthermore, to thereby achieve high emission efficiency and long lifespan of the blue fluorescent emission layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device, comprising:
   a first emitting part on an anode, the first emitting part including a first emission layer and a first hole transport layer;
   a second emitting part on the first emitting part, the second emitting part including:
      a second emission layer; and
      a second hole transport layer;
   a third emitting part on the second emitting part, the third emitting part including:
      a third emission layer; and
      a third hole transport layer; and
   a cathode on the third emitting part,
   wherein the third emitting part further includes:
      a fourth emission layer that emits light whose color is the same as that of the third emission layer and is on the third emission layer, and
      a fourth hole transport layer on the third hole transport layer and is in contact with the third emission layer, and
   wherein a hole mobility of the fourth hole transport layer is lower than a hole mobility of the third hole transport layer.

2. The organic light emitting device according to claim 1, wherein:
   the hole mobility of the third hole transport layer is $5.0 \times 10^{-5}$ cm$^2$Vs~$9.0 \times 10^{-3}$ cm$^2$Vs; and
   the hole mobility of the fourth hole transport layer is $5.0 \times 10^{-6}$ cm$^2$Vs~$5.0 \times 10^{-4}$ cm$^2$/Vs.

3. The organic light emitting device according to claim 1, wherein at least one of the first to fourth emission layers includes:
   a mixed host, obtained by mixing at least two hosts; and
   a dopant.

4. The organic light emitting device according to claim 1, wherein at least one of the first emitting part, the second emitting part, and the third emitting part further includes an electron transport layer.

5. The organic light emitting device according to claim 1, further comprising:
   a first charge generation layer between the first emitting part and the second emitting part; and
   a second charge generation layer between the second emitting part and the third emitting part.

6. The organic light emitting device according to claim 1, wherein the third emission layer and the fourth emission layer emit blue light.

7. The organic light emitting device according to claim 1, wherein the second emission layer emits yellow and green light.

8. The organic light emitting device according to claim 7, wherein the second emitting part further includes a fifth emission layer that emits red light.

9. An organic light emitting device, comprising:
a first emitting part on an anode, the first emitting part including:
a first emission layer; and
a first hole transport layer;
a second emitting part on the first emitting part, the second emitting part including:
a second emission layer; and
a second hole transport layer;
a third emitting part on the second emitting part, the third emitting part including:
a third emission layer; and
a third hole transport layer; and
a cathode on the third emitting part,
wherein the third emitting part further includes:
a fourth emission layer that emits light whose color is the same as that of the third emission layer and includes a dopant and a mixed host obtained by mixing at least two hosts for enhancing an emission efficiency, and
a fourth hole transport layer on the third hole transport layer and is in contact with the third emission layer, and has a hole mobility lower than that of the third hole transport layer to prevent an electron transfer.

10. The organic light emitting device according to claim 9, wherein:
a hole mobility of the third hole transport layer is $5.0\times 10^{-5}$ cm$^2$/Vs~$9.0\times 10^{-3}$ cm$^2$/Vs; and
a hole mobility of the fourth hole transport layer is $5.0\times 10^{-6}$ cm$^2$/Vs~$5.0\times 10^{-4}$ cm$^2$Ns.

11. The organic light emitting device according to claim 9, wherein at least one of the first emitting part, the second emitting part, and the third emitting part further includes an electron transport layer.

12. The organic light emitting device according to claim 9, further comprising:
a first charge generation layer between the first emitting part and the second emitting part; and
a second charge generation layer between the second emitting part and the third emitting part.

13. An organic light emitting device, comprising:
a first emitting part on an anode, the first emitting part including a first emission layer;
a second emitting part on the first emitting part, the second emitting part including a second emission layer;
a third emitting part on the second emitting part, the third emitting part including a third emission layer; and
a cathode on the third emitting part,
wherein the second emitting part further includes a fourth emission layer below the second emission layer, and
wherein the third emitting part further includes a fifth emission layer that emits light whose color is the same as that of the third emission layer and is on the third emission layer.

14. The organic light emitting device according to claim 13, wherein the third emission layer and the fifth emission layer emit blue light.

15. The organic light emitting device according to claim 13, wherein the second emission layer emits yellow and green light.

16. The organic light emitting device according to claim 15, wherein the fourth emission layer emits red light.

17. The organic light emitting device according to claim 13, wherein at least one of the first to fifth emission layers includes:
a dopant; and
a mixed host obtained by mixing at least two hosts.

18. The organic light emitting device according to claim 13, wherein at least one of the first emitting part, the second emitting part, and the third emitting part further includes at least one of electron transport layer and hole transport layer.

19. The organic light emitting device according to claim 13, further comprising:
a first charge generation layer between the first emitting part and the second emitting part; and
a second charge generation layer between the second emitting part and the third emitting part.

* * * * *